United States Patent [19]

Ohuchi et al.

[11] 4,302,763
[45] Nov. 24, 1981

[54] SEMICONDUCTOR DEVICE

[75] Inventors: Norikazu Ohuchi; Hisayoshi Yamoto; Hisao Hayashi; Takeshi Matsushita, all of Atsugi, Japan

[73] Assignee: Sony Corporation, Tokyo, Japan

[21] Appl. No.: 65,262

[22] Filed: Aug. 9, 1979

[30] Foreign Application Priority Data

Aug. 14, 1978 [JP] Japan .................................. 53-98824
Aug. 14, 1978 [JP] Japan .................................. 53-98826
Jun. 29, 1979 [JP] Japan .................................. 54-83211

[51] Int. Cl.³ .......................................... H01L 29/161
[52] U.S. Cl. ...................................... 357/16; 357/59; 357/63; 357/34
[58] Field of Search ....................... 357/59, 34, 16, 63, 357/38

[56] References Cited

U.S. PATENT DOCUMENTS 4,001,762  1/1977  Aoki ..................................... 338/309
4,062,034  12/1977 Matsushita ............................ 357/16
4,114,254  9/1978  Aoki ..................................... 357/59 X
4,161,744  7/1979  Blaske .................................. 357/59
4,176,372  11/1979 Matsushita ............................ 357/52
4,188,707  2/1980  Asano et al. .......................... 29/571
4,190,466  2/1980  Bhattacharyya ...................... 148/1.5
4,197,632  4/1980  Aomura ................................ 29/574

Primary Examiner—Martin H. Edlow
Attorney, Agent, or Firm—Hill, Van Santen, Steadman, Chiara & Simpson

[57] ABSTRACT

A semiconductor device includes a semiconductor substrate, a first region of first conductivity type in the substrate, a second region of second conductivity type in the substrate and adjacent to the first region, a third region of the first conductivity type adjacent to the second region having at least a portion on the substrate which is comprised of the same element as the substrate and oxygen, the band gap energy of the portion being larger than that of the second region and means for transporting majority carriers in the first region to the third region.

2 Claims, 23 Drawing Figures

SEMICONDUCTOR DEVICE

BACKGROUND OF THE INVENTION

1. Field of the Invention

This invention relates to a semiconductor device which includes a first semiconductor region of a first conductivity type formed in a semiconductor substrate, a second semiconductor region of a second conductivity type formed on the first semiconductor region in the semiconductor region, a third semiconductor region of the first conductivity type formed on the second semiconductor region, and electrodes arranged on the first, second and third semiconductor regions, respectively. More particularly, this invention is directed to a hetero-junction bipolar transistor or GCS (Gate Controlled Switch).

2. Description of the Prior Art

Generally, the energy band gap of an emitter region is wider than energy band gap of a base region or a collector region. The energy band gap functions as a barrier against minority carriers being injected from the base region. The rate at which minority carriers move toward the emitter region are recombined with electrons, is reduced by the barrier. Accordingly, base current $I_B$ is decreased, and a current gain will result. However, since the recombination speed is high in the junction, a transistor of sufficiently high current gain has not yet been developed.

SUMMARY OF THE INVENTION

An object of this invention is to provide a semiconductor device which has a high current gain $h_{FE}$.

Another object of this invention is to provide a semiconductor device which has superior switching characteristics.

A further object of this invention is to provide a semiconductor device in which concentration of electrical current is prevented, and breakdown does not occur.

A still further object of this invention is to provide a method by which the resistivity of an emitter of a transistor or a cathode of a thyristor, can be adjusted with accuracy to a desired range.

A still further object of this invention is to provide a method by which the above described emitter which has low concentration can be formed with accurate control.

In accordance with an aspect of this invention, a semiconductor device comprising a semiconductor substrate has, a first region of first conductivity type formed in said substrate. A second region of second conductivity type is formed in said substrate adjacent to said first region. A third region of the first conductivity type if formed adjacent to said second region and has at least a portion on said substrate. The third region is formed of the same element as said substrate and oxygen with, the band gap energy of said third region being larger than that of said second region. Means are provided for transporting majority carriers in said first region to said third region.

Other objects, features, and advantages of the present invention will be apparent from the following description taken in conjunction with the accompanying drawings.

DESCRIPTION OF THE PREFERRED EMBODIMENTS

Next, there will be described a hetero-junction bipolar transistor according to embodiments of this invention with reference to the drawings.

Figure 1:
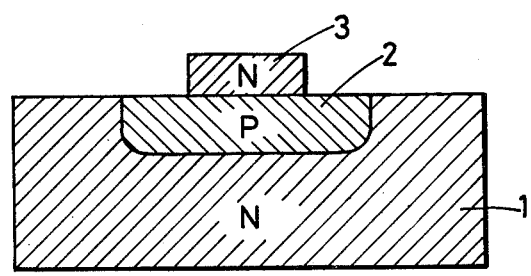
FIG. 1 is a cross-sectional view of a basic construction of a hetero-junction bipolar transistor according to a first embodiment of this invention.
Figure 2:
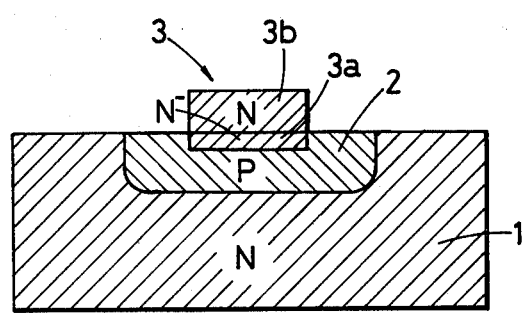
FIG. 2 is a cross-sectional view of a basic construction of a hetero-junction bipolar transistor according to a second embodiment of this invention.

First, basic constructions of the embodiments will be described with reference to FIG. 1 and FIG. 2. FIG. 1 illustrates one of the basic constructions in which a P-type base region 2 is formed on an N-type collector silicon substrate 1 by diffusion. An N-type Polysilicon layer or a layer 3 to be described hereinafter is formed on the base region 2. The layer 3 functions as an emitter region. FIG. 2 illustrates another embodiment in which, an $N^-$-type semiconductor region $3a$ of low concentration is formed in the base region 2 by diffusion. A layer $3b$ is formed on the $N^-$-type semiconductor region $3a$. An emitter region 3 is formed by the region $3a$ and layer $3b$.

The layer 3 and $3b$ comprise semi-insulating polysilicon layers (N-type layers) containing predetermined impurities and oxygen. During their manufacture, $SiH_4$ as a Si supply source, $N_2O$ as an O supply source and $PH_3$ as a P supply source are fed onto the semiconductor substrate 1, using $N_2$ gas as a carrier gas. These components are thermally decomposed at a temperature of 650° C. to form a thin film of. For example, the layer $3b$ consists of 44 at% (by atom numbers) oxygen, 0.6 at% phosphorous and 55.4 at% silicon. The resistivity of the layer $3b$ is $10^{-2}$ to $10^6\Omega$ cm, depending on the content of phosphorous. It is lower than the resistivity of a pure polysilicon layer containing oxygen which is $10^8$ to $10^{10}\Omega$ cm. Such a low resistivity is obtained, for example, by annealing for 60 minutes at 1000° C. after the vapor growth has occurred. The reason for this is believed to be that inactive P-atoms are activated by the annealing and the Fermi level is shifted to the conduction band side.

Figure 3:
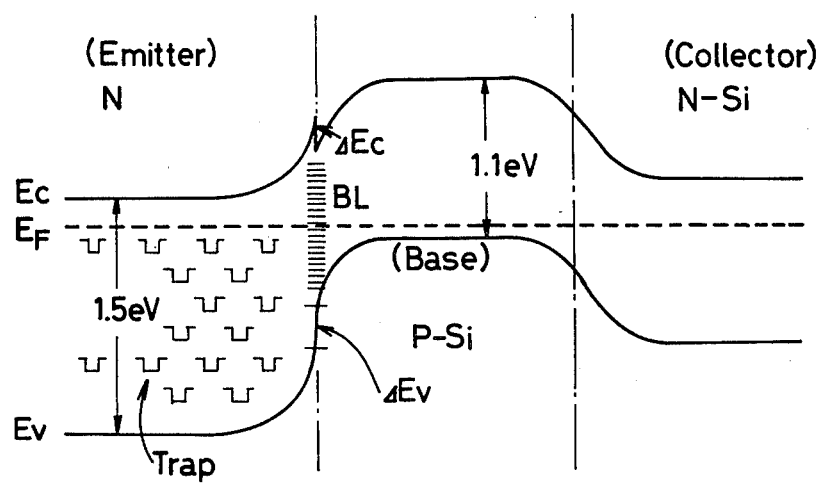
FIG. 3 is a chart illustrating the energy band of the transistor of FIG. 1.
Figure 4:
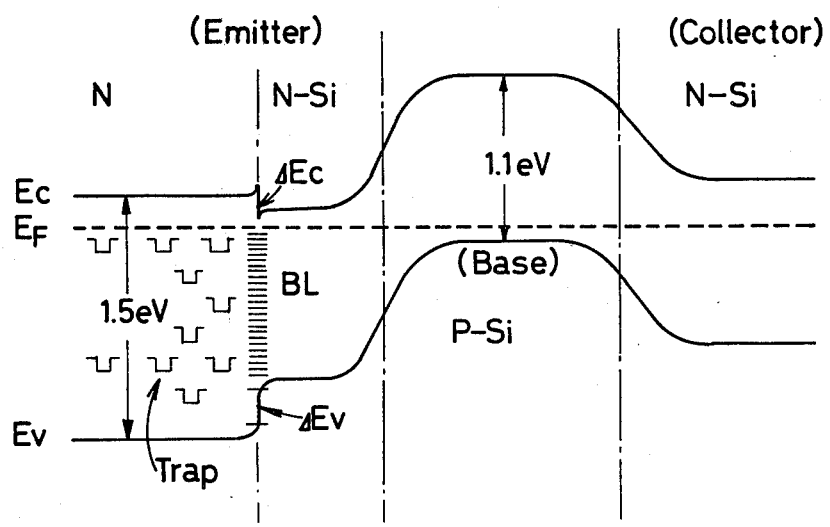
FIG. 4 is a chart illustrating the energy band of the transistor of FIG. 2.

Energy bands of the hetero-junction bipolar transistors including the layers are shown in FIG. 3 and FIG. 4 which correspond to the transistors of FIG. 1 and FIG. 2, respectively. Properties of material containing a large amount of oxygen are similar to those of $SiO_2$. The band gap of such material is larger than that of normal Si. As shown in FIG. 3 and FIG. 4, the value for $3b$ is 1.5 eV, and for Si is 1.1 eV. Accordingly, a hole barrier $\Delta E_V$ of about 0.2 eV exists at a hetero junction portion between the layer $3b$ and $S_i$. It is difficult for holes to move from the base region into the emitter region, because of the hole barrier $\Delta E_V$ (FIG. 3), or the holes are bounded by the hole barrier $\Delta E_V$ (FIG. 4). As shown in FIG. 4, it is required that the depth of the emitter region $3a$ be less than the diffusion length of the minority carrier (hole). Accordingly, since the holes moving toward the emitter region are effectively bounded by the hole barrier $\Delta E_V$, the recombination rate of the holes is greatly decreased, and a higher $h_{FE}$ can be obtained than in a homo-junction type transistor. The concentration of impurities in the base region can be increased substantially for the same $h_{FE}$. In other words, the resistivity of the base region can be substantially decreased. This is very advantageous for a switching element.

In the transistor of FIG. 3, an N-type $S_i$ emitter region does not exist as it does in the transistor of FIG. 4. The N-type layer directly contacts the P-type base region. Accordingly, very few holes will be stored or injected from the base region into the emitter region. For that reason, the transistor of FIG. 3 has superior frequency characteristics. When the layers 3 and $3b$ contain a certain amount of oxygen, they have high a passivation effect, and contribute to the improvement of the electrical characteristics.

Boundary levels (BL) exist at the boundary surface between the layer and the Si layer. The boundary levels function as recombination centers. Accordingly, it is preferable to remove the boundary levels by annealing. For example, as shown in FIG. 3, the transistor is annealed at 900° C. for ten minutes under an atmosphere of $N_2$ gas, and in FIG. 4, the transistor is annealed at 1000° C. for ten minutes under an atmosphere of $N_2$ gas. Also when the transistor is annealed at the lower temperature (for example, 350° C.) under an atmosphere of $H_2$ gas, the recombination rate at the boundary is reduced, and the injection efficiency is raised.

The transistor according to the embodiment can be manufactured by a usual diffusion technique and a vapour growth method. However, particularly the $N^-$-type region $3a$ of low concentration may be formed by using the SIPOS layer $3b$ as a diffusion source. In that case, impurities of the POPOS layer $3b$ are diffused, for a small depth, into the P-type base region 2 to convert the surface layer of the latter to an N-type region. Thus, the N-type region $3a$ has an impurity concentration that is lower than $10^{19}/cm^3$, for example, $10^{18}/cm^3$, is formed on the P-type region 2.

Figure 5:
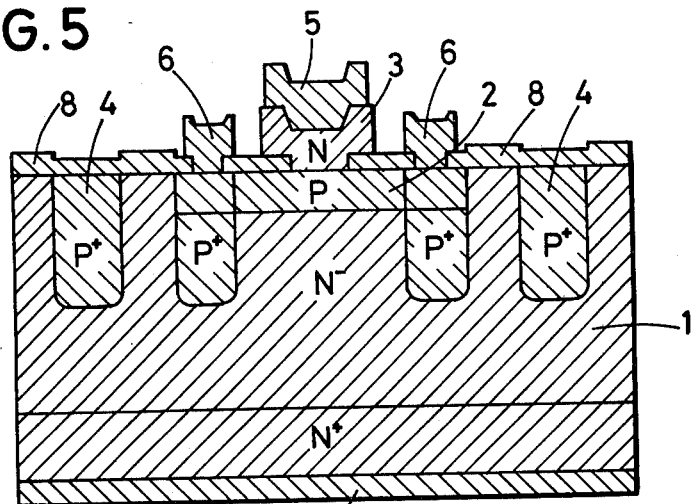
FIG. 5 is a cross-sectional view of a transistor according to a first embodiment of this invention, corresponding to FIG. 1.

FIG. 5 shows an actual hetero-junction bipolar transistor according to one embodiment of this invention. Parts in this embodiment which correspond to those in FIG. 1, are denoted by the same reference numerals. The base region 2 is formed on the region 1 by an ion plantation method. A $P^+$-type guard rind 4 is formed around the base region 2 in the region 1. A $SiO_2$ film 8 is formed on the region 1. An emitter electrode 5, a base electrode 6 and a collector electrode 7 are provided in the transistor. It is preferable that the electrodes 5, 6 and 7 be made of Al (Aluminium). However, they may consist of three layers of $T_i$ (titanium)-W (tungsten)-Al (Aluminium), with the Al-layer being nearest the contact surface.

Figure 6:
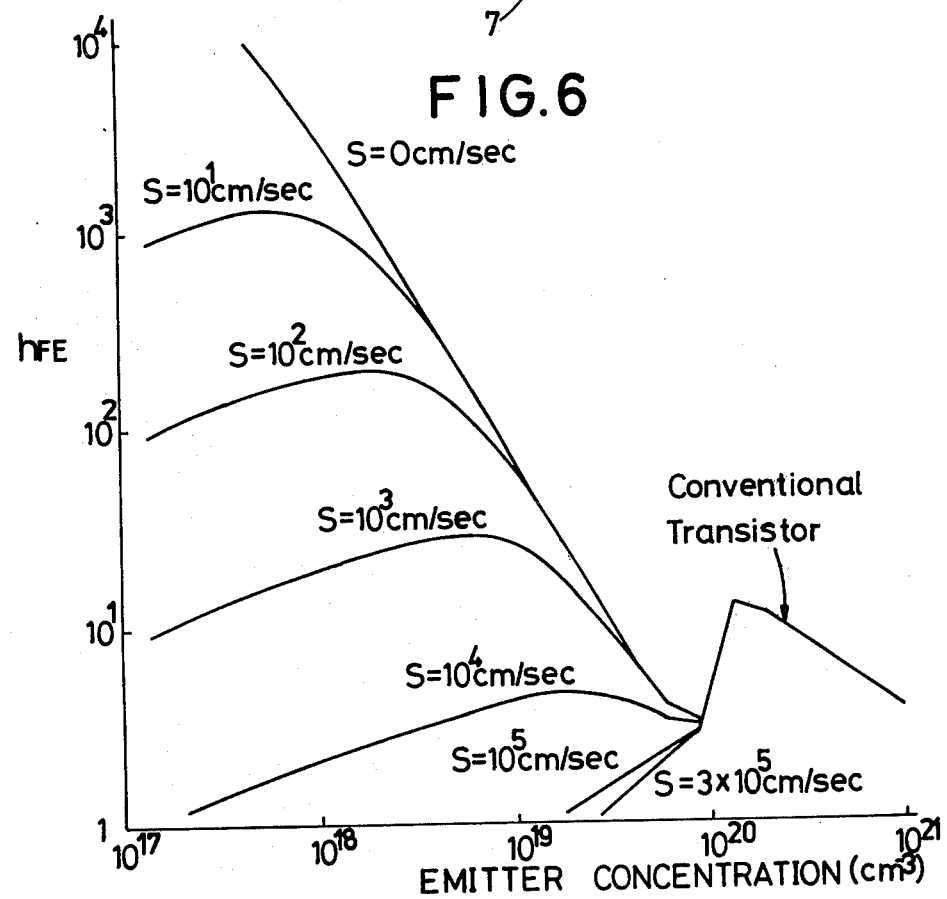
FIG. 6 is a graph showing the relationship between emitter concentration and $h_{FE}$ at different recombination speeds.

FIG. 6 shows the relationship between the emitter concentration and $h_{FE}$. In this relationship, the emitter depth is $0.3\mu$, the recombination speed S between Al and $S_i$ is equal to $3 \times 10^5$ cm/sec, the recombination speed S between polysilicon and Si is equal to 5000 cm/sec, the recombination speed S between Si and $SiO_2$ is equal to 1 to 10 cm/sec, and the Gummel number $G_B$ of the base is equal to $1 \times 10^{13}$ sec/cm$^4$. In the conventional transistor, the emitter concentration $\gtrsim 10^{20}/cm^3$, and $h_{FE}$ is equal to about ten. On the other hand, in the transistor of this embodiment, the recombination speed S is reduced by hydrogen-annealing, and the emitter concentration is decreased, for example, to $10^{18}/cm^3$. When S is equal to 100, $h_{FE}$ is larger than 100. This shows that the correlation between the recombination speed S and $h_{FE}$ is good with respect to the value of $G_B$.

Figure 7:
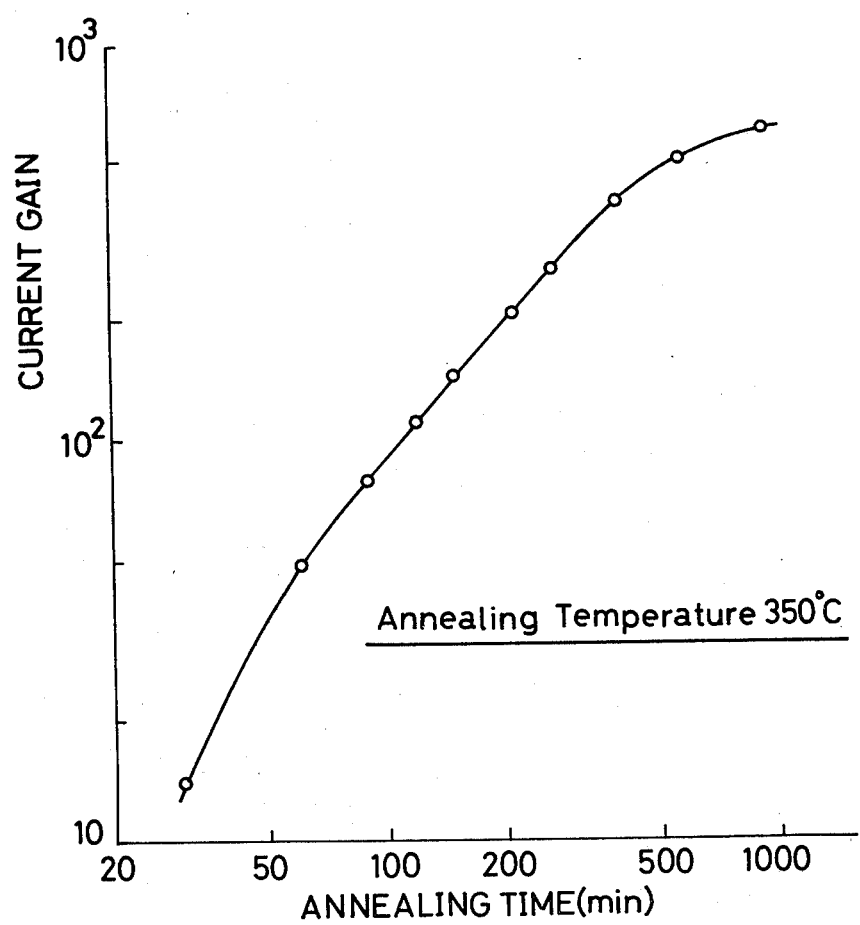
FIG. 7 is a graph showing the relationship between annealing time and current gain.

FIG. 7 shows that the current gain is increased by hydrogen-annealing. This fact means that the boundary recombination speed is decreased by doping of hydrogen atoms to increase $h_{FE}$. It was found out that the resistivity of the material containing P was reduced to about one tenth of the initial value by hydrogen-annealing. On the other hand, $H_2$ contained in the Al electrode may be doped into the material. In this case, the transistor is treated at the temperature of 350° to 500° C. for 30 minutes under the atmosphere of $N_2$. When the electrode consists of Al, water exists at the boundary between layer and Al, and it reacts with Al to product hydrogen atoms. When the three layer construction of Ti-W-Al is used as the electrode, Ti is apt to react with $H_2$, and accordingly, $H_2$ contained in Al cannot reach the boundary between layer and Si. On the other hand, when the single-layer construction of Al is used as the electrode, $H_2$ can easily reach the boundary between layer and Si. As the result, $h_{FE}$ is improved to about ten times of the initial value. The resistivity of the layer and therefore the emitter resistance are decreased substantially ($r_3 \sim 0.065\Omega$).

Figure 8:
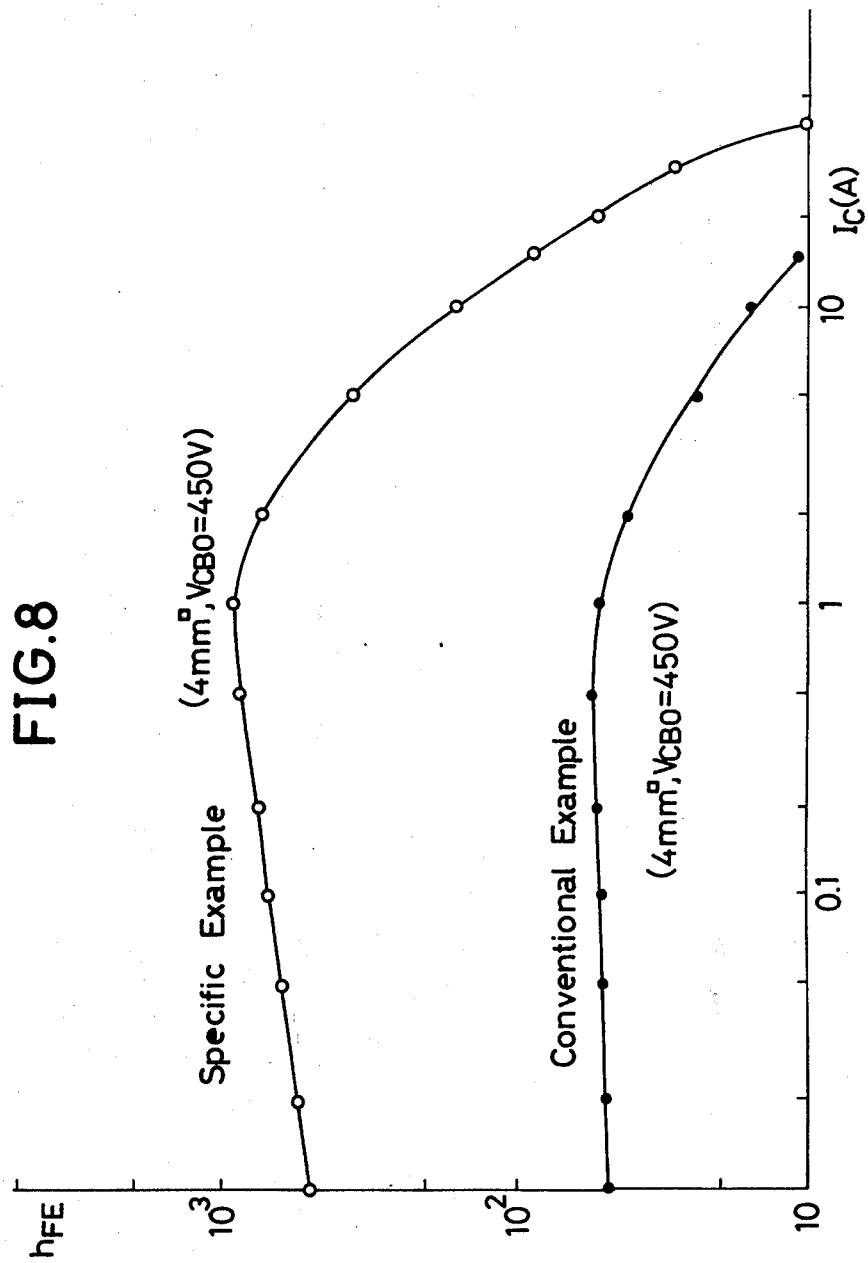
FIG. 8 is a graph showing the relationship between $h_{FE}$ and collector current $I_c$.

FIG. 8 shows the $h_{FE}$ characteristic of the transistor according to this embodiment. It is understood from FIG. 8 that $h_{FE}$ is substantially increased in comparison with that of a usual high concentration emitter ($\gtrsim 10^{19}/cm^3$).

Figure 9:
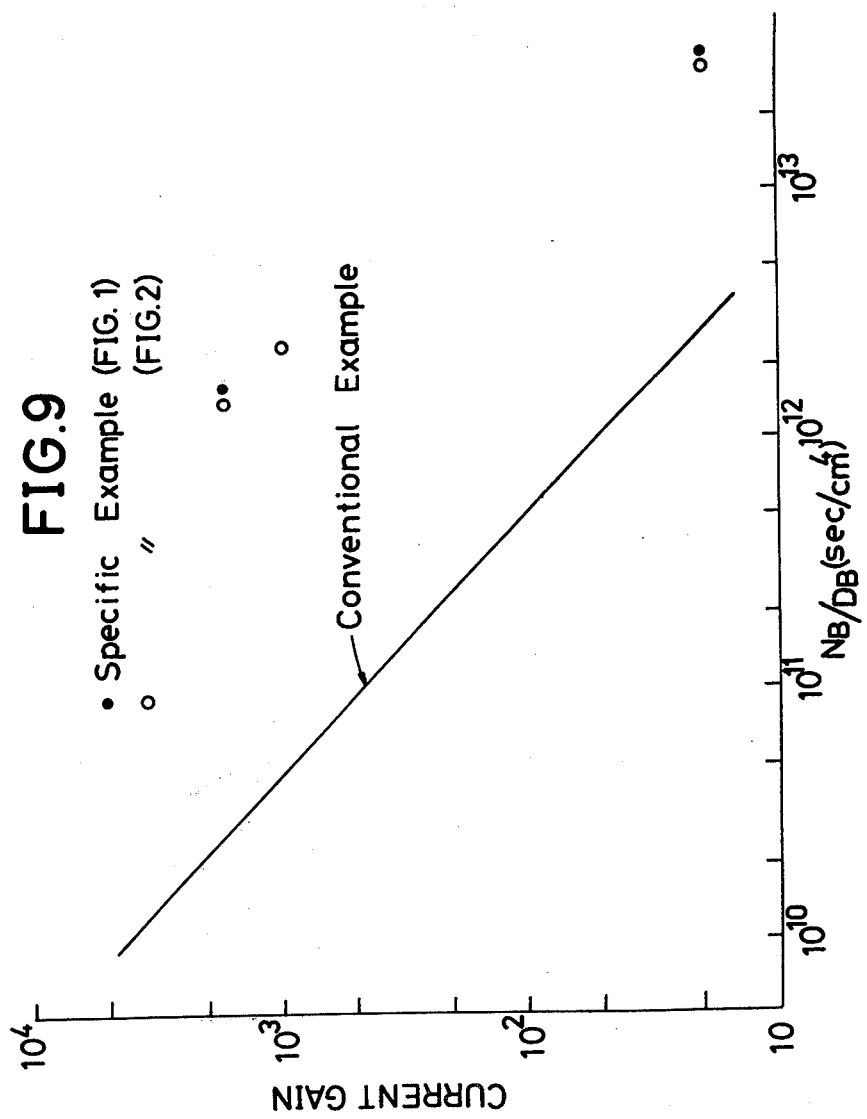
FIG. 9 is a graph showing the relationship between $N_B/D_B$ and current gain, where $N_B$ represents base impurity concentration and $D_B$ represents the base diffusion constant of minority carriers.

Generally, the current gain of a transistor is reversely proportional to the value of $N_B/D_B$, where $N_B$ represents the base impurity concentration/$cm^2$, and $D_B$ represents the base diffusion constant of the minority carriers. Such a relationship is shown in FIG. 9. It is understood from FIG. 9 that the current gain of the transistor according to this embodiment is more than fifty times as large as that of the conventional homo-junction transistor.

Figure 10:
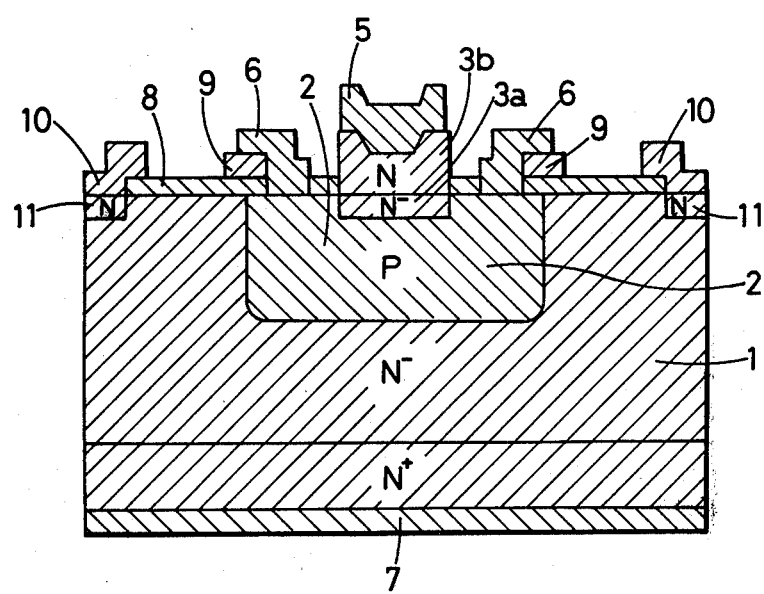
FIG. 10 is a cross-sectional view of a transistor according to a second embodiment of this invention, corresponding to FIG. 2.

FIG. 10 shows a second embodiment of this invention which is an improvement of the device of FIG. 5. Parts in this embodiment which correspond to those in FIG. 5, are denoted by the same reference numerals. In this embodiment, a layer 9 is formed also above the base-collector junction, and it constitutes a part of a protruded electrode which overlies the base-collector junction. Accordingly, the electrical field adjacent to the junction is decreased so as improve the reliability of the transistor. In contrast with the transistor of FIG. 5, the shallow $N^-$-type emitter region 3a is formed by diffusion of the impurities from the layer 3b. At the same time, an N-type channel stopper 11 is formed in the region 1 by diffusion of impurities of a film 10 which is formed away from the region 2. Thus, after the films 3b and 10 are formed on the region 2, the shallow emitter region 3a and the channel stopper 11 are formed at the same time. This fact shortens the manufacturing time of the transistor. The film 10 above the channel stopper 11 can function as a protruded electrode. Accordingly, the reliability is further improved. As in the transistor of FIG. 5, the Al electrodes 5 and 6 are formed on the layers 3b and 9. The $SiO_2$ layer 8 can be protected from Al by the layers 3b and 9.

As above described, the annealing operation is effected to reduce the boundary levels between layer and Si and to raise $h_{FE}$. In this case, it was found out that it is preferable to use a wafer structure (100) as the semiconductor substrate. The boundary level density in the wafer of structure (100) is about half of that in a wafer structure (111). The reason for this is that the number of bonds is smaller.

A photo device having a hetero-junction of the layer and Si is considered as an application of the above-described structure. Also in this case, the hydrogen-annealing is necessary. A solar battery is considered as one example of the application. The open-circuit terminal voltage is improved by about 60 to 120 mV. The efficiency is expected to be raised by 2 to 4%. The thickness of the layer receiving light is so adjusted that it is non-reflective. A light-emitting diode (LED) is considered as another example of the application. Minority carriers are difficult to store in the N-layer of a usual $N^+$-N-$P^+$ structure. Accordingly, a silicon LED of high efficiency cannot be obtained by the usual structure. However, carriers are captured in the N and P layers of a double hetero-junction structure of a layers containing boron. Accordingly, a LED of high efficiency can be obtained by the double hetero-junction structure.

Generally, a small emitter current flows with a small light signal in a photo-transistor. Accordingly, a junction impedance between emitter and base is high, and a value of $r_e C_{BE}$ is so large as to lengthen response time of the photo-transistor. If a large emitter current flows with a small light signal, a value of $r_e$ is small and response time of the photo-transistor is shortened. On the other hand, this embodiment including the layers having a hetero-junction shows a high $h_{FE}$ and the value of $r_e$ which is small. Accordingly, the response time of the photo-transistor is improved by one order of magnitude. For non-reflective structures, the thickness of the film is required to be $N \times (\lambda/4n)$ (N: odd number).

The resistivity, energy band gap and number of traps, of the layer can be controlled by adding amounts of oxygen and impurities. Impurities to be used may be not only N-type impurities such as P, but also P-type impurities such as B. In the above-described embodiments, the conductivity type of the semiconductor region may be converted to the opposite type. The concentration of impurity and oxygen in the layer may be changed.

Next, a method for forming the above-described layers 3, 3b, 9 and 10 will be described with reference to FIG. 12 to FIG. 22.

Generally, a semi-insulating film such as the above-described layer can be formed of polysilicon. For example, $SiH_4$ is thermally decomposed at a temperature of about 650° C. to form a polysilicon film ($\rho = 10^6 \Omega \cdot cm$). The produced polysilicon film is doped with an impurity such as B or P to control its resistivity. Such process has already been proposed.

Figure 11:
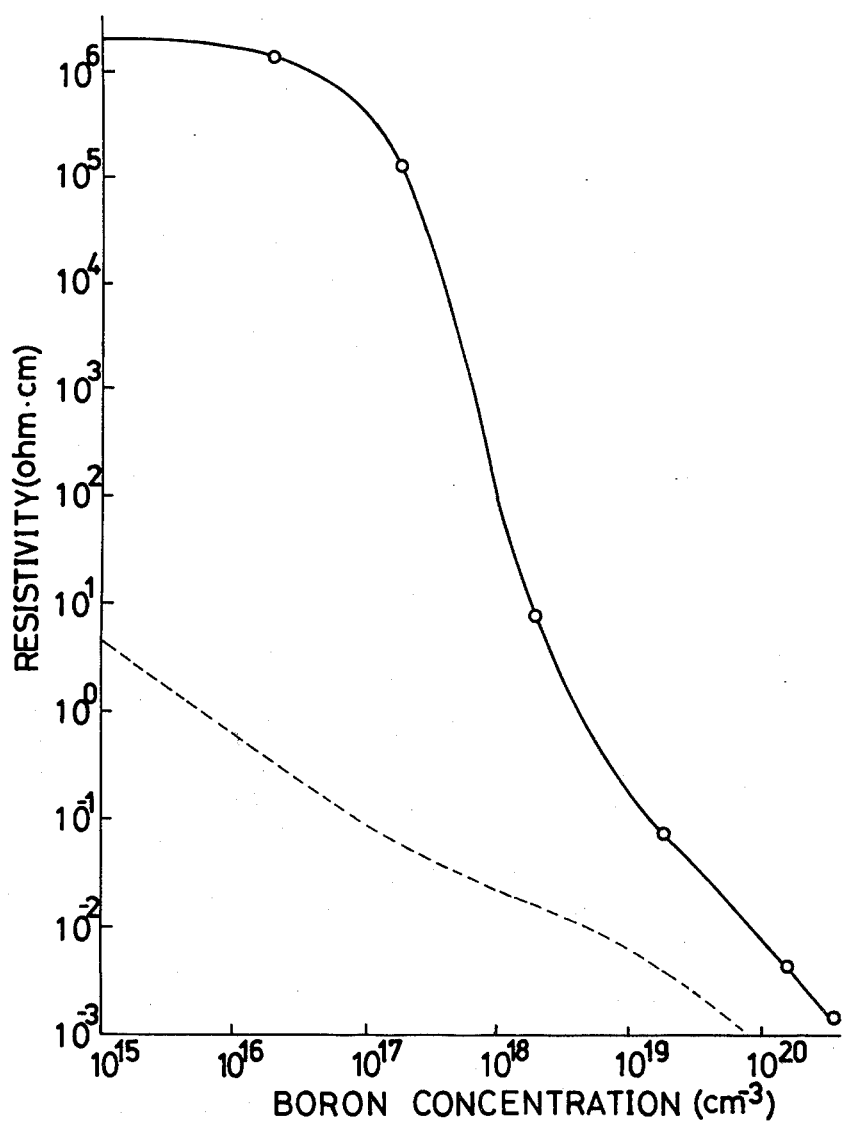
FIG. 11 is a graph showing change of resistivity when emitters of the transistors of FIG. 1 and FIG. 2 are doped only with boron.

FIG. 11 shows the relationship between the resistivity of polysilicon and the concentration of boron as the impurity in, by the solid line. The relationship between the resistivity of polysilicon and concentration of posphor is similar to the relationship between the resistivity of polysilicon and concentration of boron. It will be understood from FIG. 11 that the resistivity steeply changes within the range of $10^{-1}$ to $10^5 \Omega \cdot cm$. Accordingly, it is very difficult or impossible to adjust the resistivity of the polysilicon to a desired value (0.1 to 100 $\Omega cm$). The dotted line in FIG. 11 shows the case where single-crystalline silicon is doped with boron as the impurity. It will be understood from FIG. 11 that the resistivity of the single-crystalline silicon changes slower than that of the polysilicon.

The method to be described with reference to FIG. 12 to FIG. 22 overcomes the above described defect of the already proposed process.

Figure 12:
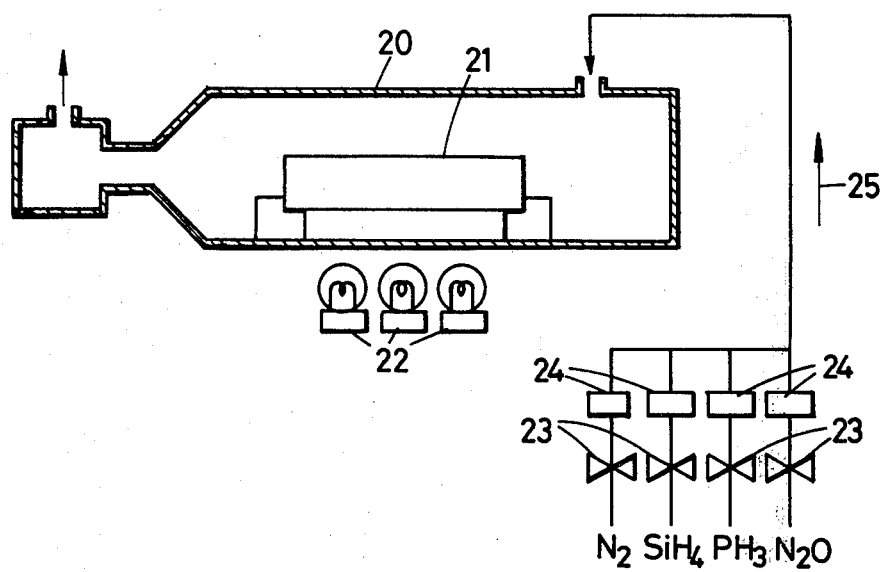
FIG. 12 is a schematic cross-sectional view of a vapor growth apparatus.

A vapor growth apparatus shown in FIG. 12 is used for forming the film according to this embodiment. The apparatus is called a "horizontal reaction furnace". In a furnace 20, a silicon wafer (not shown) is subjected to diffusion treatment and is put on a susceptive plate 21 as a supporter, and is heated at the growth temperature of 640° C. by external infrared lamps 22, while predetermined mixing gas 25 is introduced into the furnace 20 through valves 23 and flow meters 24. The mixing gas 25 consists of monosilane ($SiH_4$), nitrous oxide ($N_2O$)

and phosfin ($PH_3$). $N_2$ as carrier gas flows into the furnace 20 at the rate of 25 l/min. The mixing gas 25 is supplied onto the wafer together with the carrier gas. While $SiH_4$ and $PH_3$ are thermally decomposed to form a film of polysilicon containing uniformly P on the wafer, oxidation reaction of $N_2O$ proceeds to dope uniformly the growing polysilicon film with oxygen.

Figure 13:
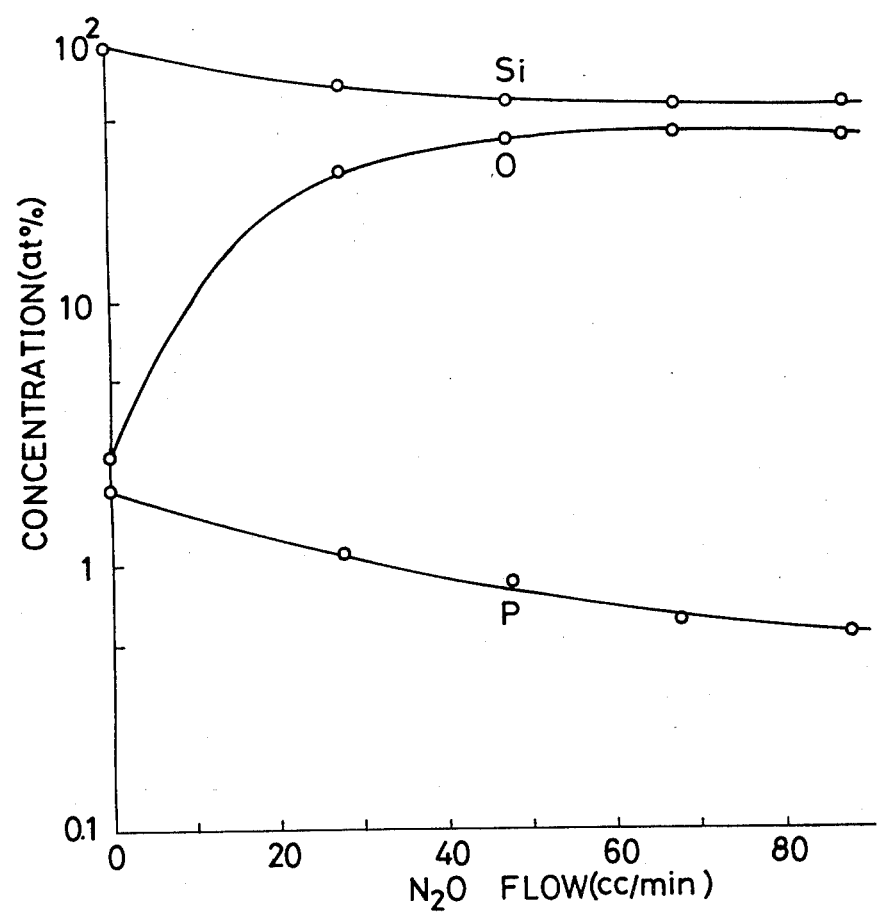
FIG. 13 is a graph showing the relationship between silicon, oxygen and phosphor concentrations and flow rate of $N_2O$ at a constant flow rate of $PH_3$.

In the thermal decomposition reaction, $SiH_4$ *flows at the constant rate of* 30 cc/min and $PH_3$ flows at the constant rate of 0.198 cc/min (330ppm ×600 cc/min). It is important that the flow rate of $PH_3$ is high enough so that the polysilicon is doped with P almost to the saturation point or the solid solution limit. The flow rate of $N_2O$ was changed to 0 m/min, 28 cc/min, 48 cc/min, 68 cc/min and 88 cc/min to form five composite films of oxygen, phosphor and polysilicon which are different from each other in composition. The composite film functions as an emitter ballast resistor. The compositions of the five composite films were analyzed by an X-ray micro-analizer. The results are shown in FIG. 13. It will be understood from FIG. 13 that the concentration of oxygen (at% by numbers of atoms) increases with the flow rate of $N_2O$, and the concentration of phosphor decreases therewith. Preferable ranges are 10 to 50 at% for oxygen and 0.1 to 3 at % for phosphorous, respectively.

Figure 14:
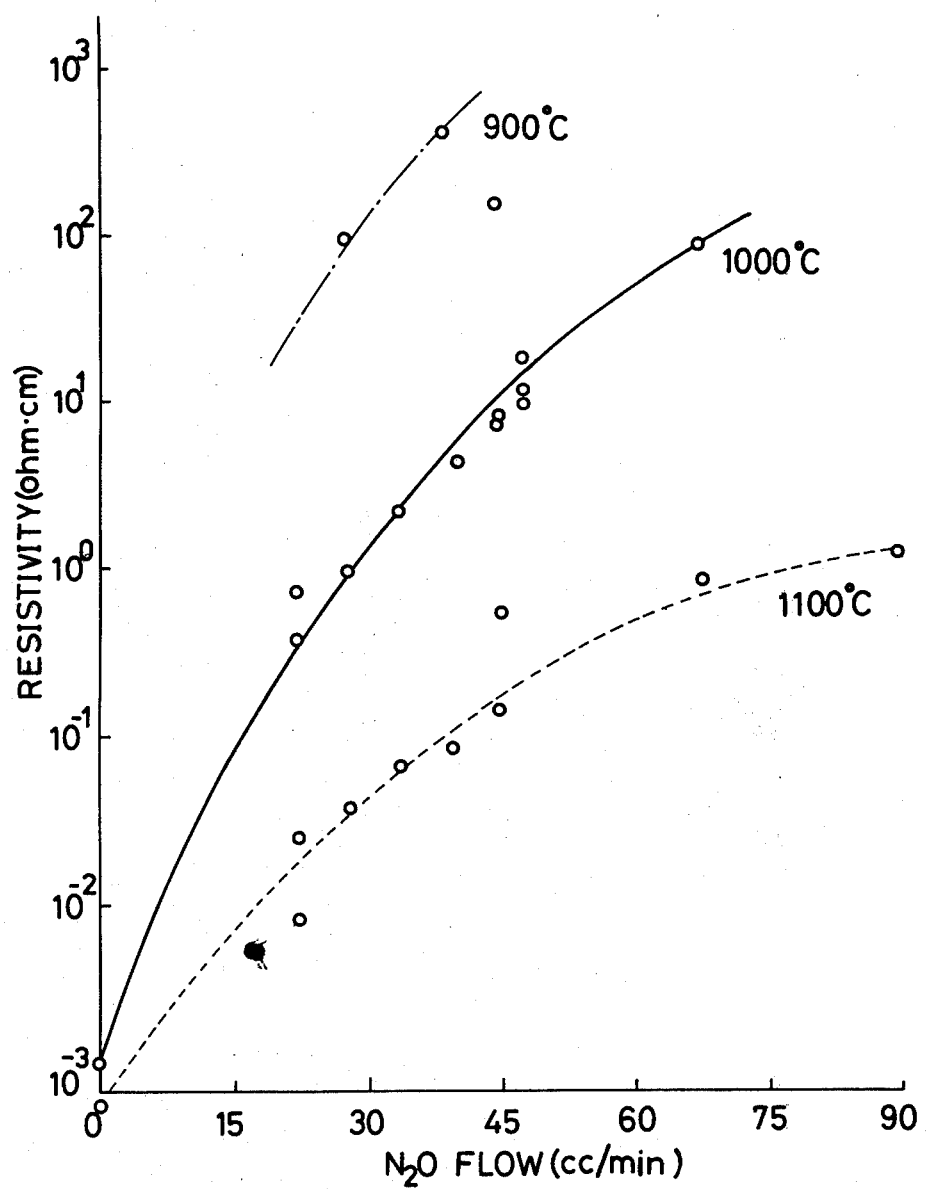
FIG. 14 is a graph showing the relationship between resistivity and flow rate of $N_2O$ at different annealing temperatures and at a constant flow rate of $PH_3$.

The resistivity of the thus obtained composite film is remarkably high. Next, it is annealed to activate the impurity. Although the annealing time was sixty minutes in each case, the annealing temperature was changed to 900° C., 1000° C. and 1100° C. under the same atmosphere of $N_2$. The results are shown in FIG. 14. It will be understood from FIG. 14 that the resistivity depends on the annealing temperature and it increases with the flow rate of $N_2O$ at the same annealing temperature. Accordingly, when other conditions are maintained, the resistivity can be controlled exactly to 0.1 to 100Ω·cm.

At the constant flow rate of $PH_3$, the resistivity is increased with the flow rate of $N_2O$, namely in accordance with the doping amount of oxygen. Thus, the resistivity can be adjusted to a desired value. Since the flow rate of $PH_3$ is as high as 0.198 cc/min, the composite film is doped with phosphor almost to the saturation point. The concentration of phosphor is more than $10^{20}$ $cm^{-3}$ which is near the solid solution limit. It is considered that the composite film cannot be doped with phosphor beyond a concentration of $10^{21}$ $cm^{-3}$. It will be understood from FIG. 11 that the resistivity does not change so much with variations of concentrations of phosphor near such a high concentration as $10^{20}$ $cm^{-3}$ in contrast with such lower concentration as $10^{17}$ to $10^{19}$ $cm^{-3}$. Accordingly, when the concentration of phospor is as high or more than $10^{20}$ $cm^{-3}$, the resistivity of the film can be adjusted to a desired value in accordance with the flow rate of $N_2O$ for oxygen doping, regardless of variations of concentrations of phosphorous.

Figure 15:
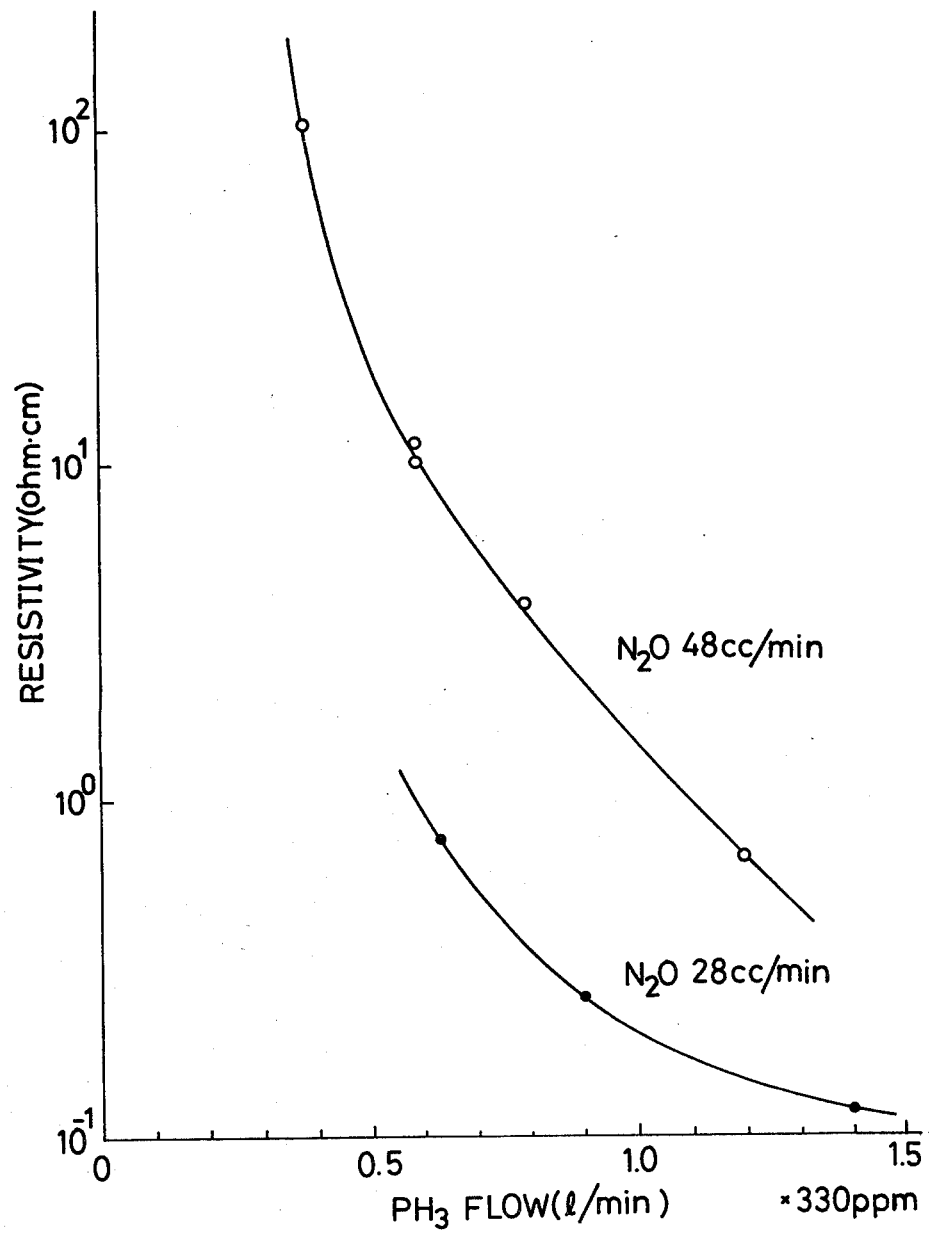
FIG. 15 is a graph showing the relationsip between resistivity and flow rate of $PH_3$ at different flow rates of $N_2O$.

FIG. 15 shows the experimental results for the relationship between the resistivity and the flow rate of $PH_3$. In this experiment, the flow rates of $SiH_4$ and $N_2$ were 30 cc/min and 25 l/min, respectively. The flow rate of $N_2O$ was changed to 28 cc/min and 48 cc/min. The composite layer was formed at the growth temperature of 640° C., and then annealed for one hour under the atmosphere of $N_2$. Thus, the test samples were obtained.

It will be understood from FIG. 15 that the resistivity can be controlled with the flow rate of $PH_3$. Further, it will be understood from the comparison with FIG. 11 that the resistivity can be easily adjusted to 0.1 to 100Ω·cm when the compound layer is doped with substantial phosphorous.

Figure 16:
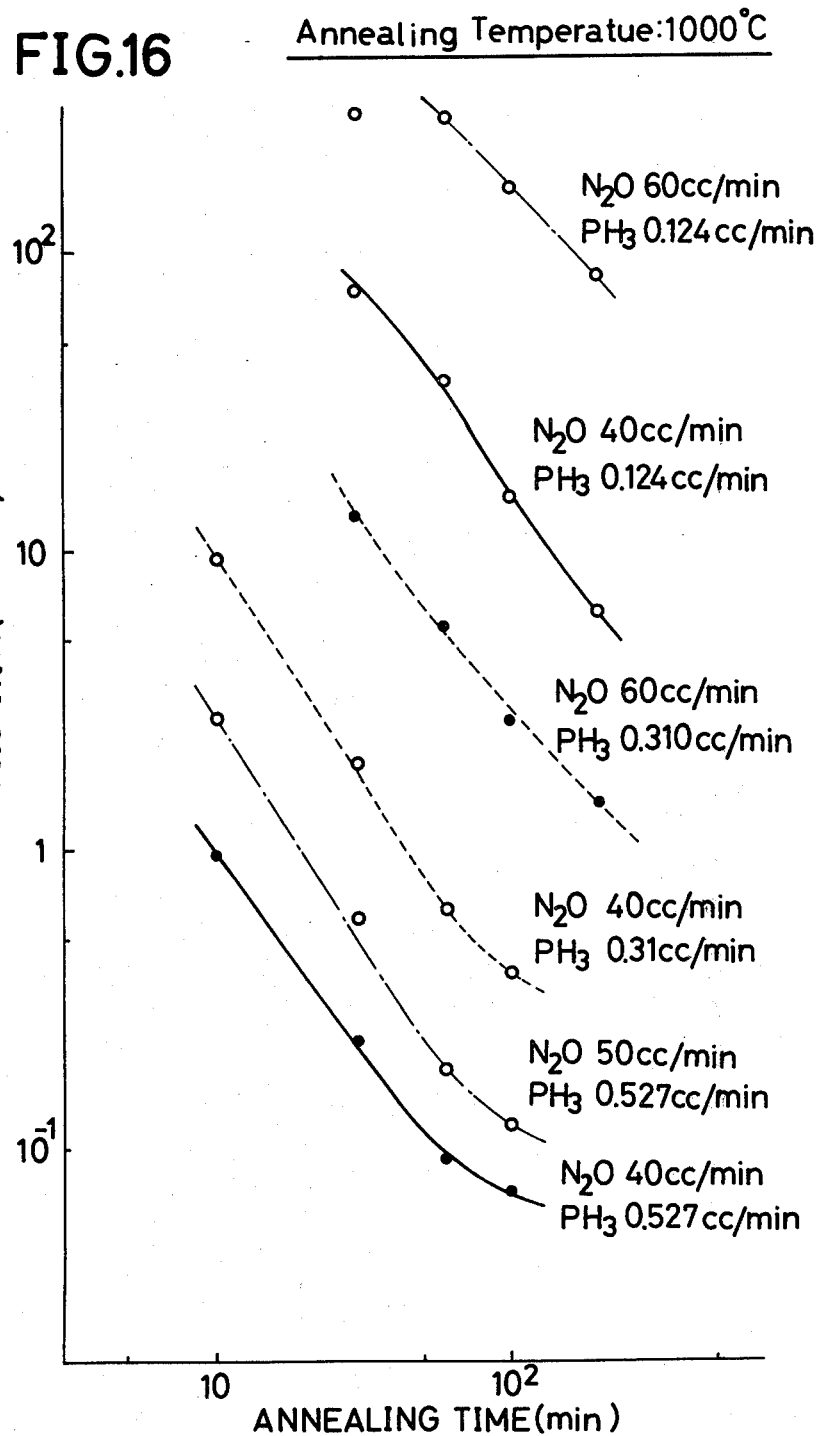
FIG. 16 is a graph showing the relationship between resistivity and annealing time at a constant annealing temperature and at different flow rates of $N_2O$ and $PH_3$.

FIG. 16 shows the experimental results of the relationship between the resistivity and the annealing time. In this experiment, the flow rates of $SiH_4$ and $N_2$ were 30 cc/min and 25 l/min, respectively. The flow rate of $PH_3$ was changed to 0.124, 0.31 and 0.527 cc/min. The flow rate of $N_2O$ was changed to 40, 50 and 60 cc/min. The composite layer was formed at the growth temperature of 640° C., and then it was annealed at the temperature of 1000° C. It will be understood from FIG. 16 that the resistivity decreases with the annealing time, and it can be exactly adjusted by controlling the annealing time to 0.1 to 100Ω·cm.

Figure 17:
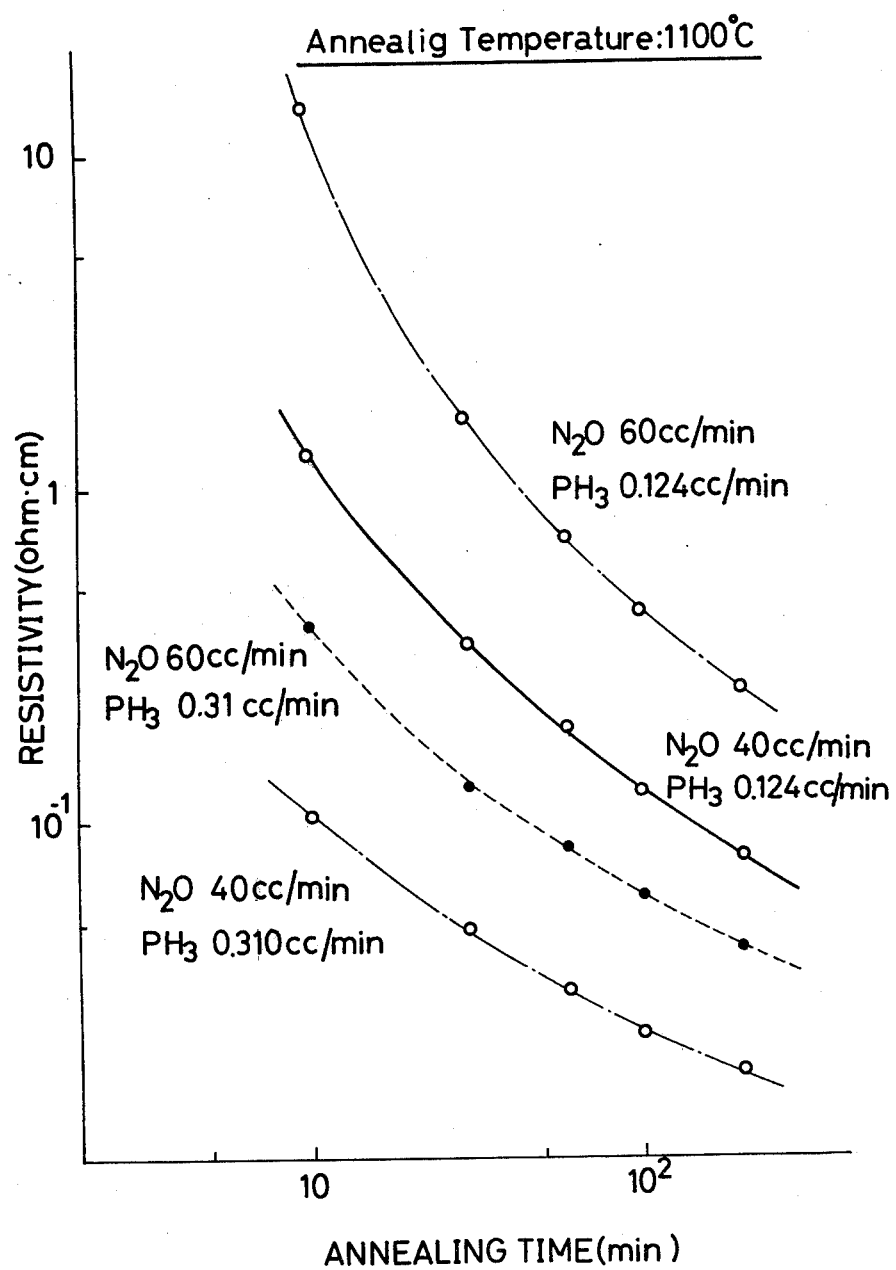
FIG. 17 is a graph showing the relationship between resistivity and annealing time at another constant annealing temperature and at different flow rates of $N_2O$ and $PH_3$.

FIG. 17 shows the experimental results of the relationship between the resistivity and the annealing time. The experimental conditions were the same as in those of FIG. 16 except that the annealing temperature was 1000° C. It will be understood from FIG. 17 that the resistivity changes with the annealing time in manner similar to FIG. 16.

Figure 18:
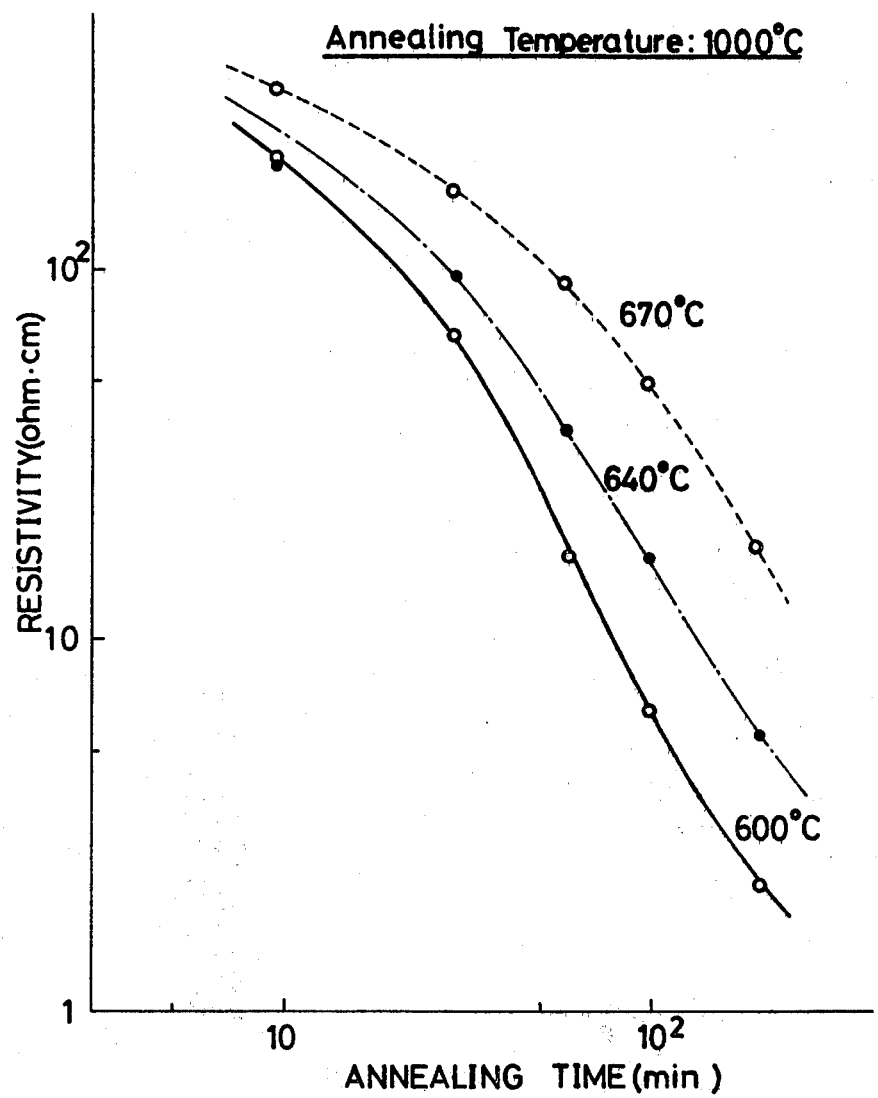
FIG. 18 is a graph showing the relationship between resistivity and annealing time at a constant annealing time and at different vapor growth temperatures.

FIG. 18 shows the experimental results of the relationship between the resistivity and the annealing time. In this experiment, the flow rates of $SiH_4$ and $PH_3$ were 30 cc/min and 0.198 cc/min. The growth temperature of the composite layer was changed to 600°, 640° and 670° C. The annealing temperature was 1000° C. It will be understood from FIG. 18 that decomposition of $N_2O$ occurs with the rise of the growth temperature which increases the resistivity.

Figure 19:
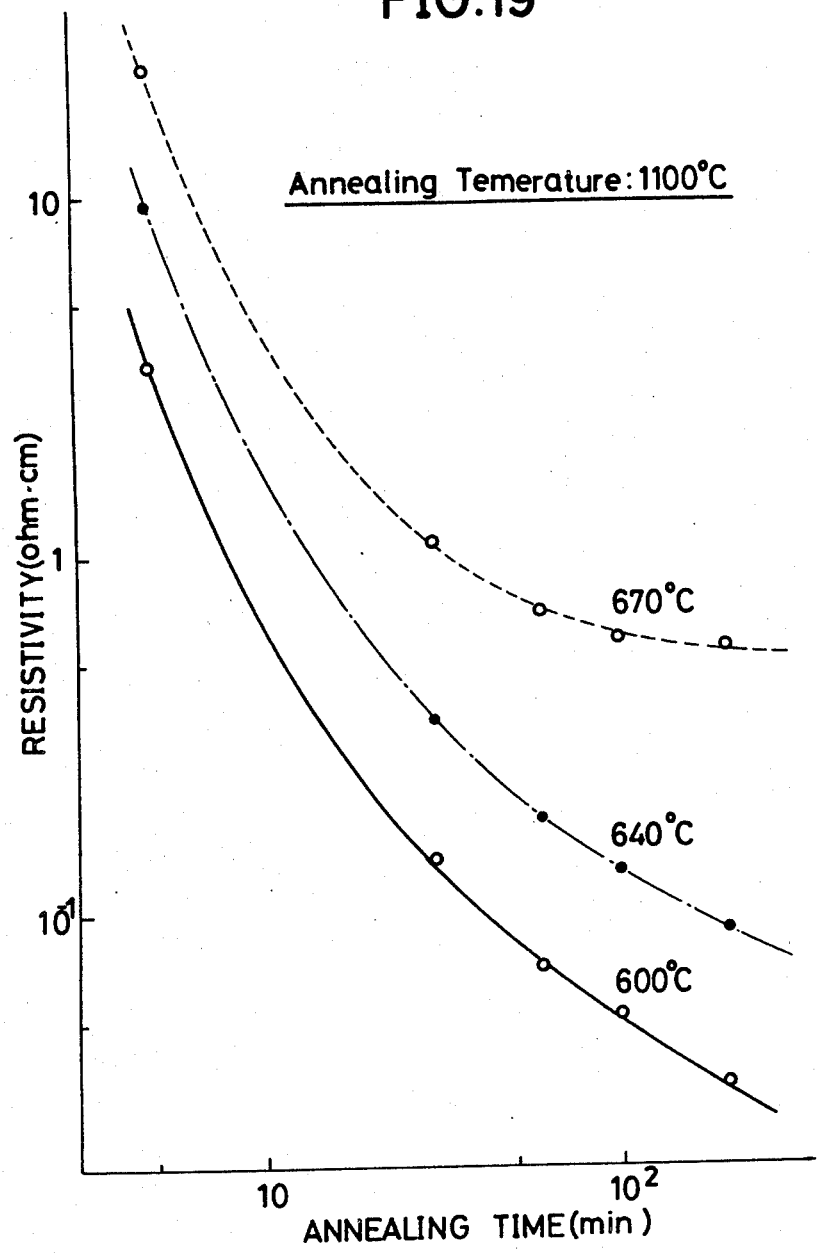
FIG. 19 is a graph showing the relationship between resistivity and annealing time at another constant annealing temperature and at different vapor growth temperature.

FIG. 19 shows the experimental results of the relationship between the resistivity and the annealing time. The experimental conditions were the same as those of FIG. 18 except that the annealing temperature was 1100° C. It will be understood from FIG. 19 that the doped impurity was activated and the resistivity was decreased, due to the higher annealing temperature.

In the above-described method, the flow rate of $N_2O$ is changed under control of the annealing temperature and time for the condition where the phosphorous concentration is high enough to be near the saturation point. Thus, a desired resistivity can be easily obtained. In this method, it is very important that much $PH_3$ be supplied so that the phosphor concentration is higher than $10^{20}$ $cm^{-3}$. In this condition, the resistivity can be adjusted to an arbitrary value within a predetermined range with the flow rate of $N_2O$. It is preferable that the annealing temperature be 900° to 1200° C. However, it be practical that it is 950° to 1100° C. When the annealing temperature is lower than 900° C., the activation is insufficient, and so the resistivity is not satisfactorily lowered. When the annealing temperature is higher than 1200° C., the resistivity becomes too low, and other regions, for example, diffusion regions are adversely affected. It is preferable for the same reasons as above that the annealing time be 10 to 200 minutes. Further, it is preferable that the vapor growth temperature be 580° to 750° C. When it is too low, the decomposition is insufficient. And when it is too high, the resistivity becomes too high.

It is preferable that the concentrations of oxygen and phosphorous in the resistive film according to this embodiment are 10 to 50 at%, and 0.1 to 3 at%. When the concentration of oxygen is lower than 10 at%, it is difficult to increase the resistivity up to the desired range. When it is higher than 50 at%, the resistivity becomes too high. When the concentration of phosphor is lower than 0.1 at%, the resistivity changes too steeply with the concentration of phosphor, and the desired resistivity is difficult to obtain. When it is higher than 3 at%, silicon cannot be doped with excessive phospor.

The film formed on the wafer according to the above-described method is etched to a predetermined shape. For example, a film of 100Ω·cm ($\rho$) can be easily brought into ohmic contact with metal or a particularly emitter electrode. Further, since the film is comprised of material of the polysilicon group, it can be easily worked, and it makes good contacts with a $SiO_2$ layer. The film may be used for a GCS or GTO thyristor (Gate Turn-Off thyristor), and may be used as a diffusion source. Further, it may be applied to a load resistor in an integrated circuit.

Material other than $SiH_4$ may be used as a silicon supply source. Instead of $N_2O$, NO, $NO_2$, $H_2O$ or $O_2$ may be used as the oxygen supply source. $NO_2$ is a preferable compound, since it has a suitable reactivity at a growth temperature near 640° C. Material other than $PH_3$ may be used as the impurity supply source. Examples of such materials are $PF_5$, $A_sH_3$, $A_sCl_3$, $S_bH_3$ or $S_bCl_5$ which are impurity supply sources of N-type, or $BCl_3$, $BBr_3$ or $B_2H_6$ which are impurity supply sources of P-type.

Next, a manufacturing method in which $B_2H_6$ is used will be described. The reaction process is similar to that in the above-described method. Mixing gases of $SiH_4$, $B_2H_6$ and $N_2O$ are fed onto a wafer together with $N_2$ gas as carrier gas. A composite layer comprising polysilicon containing predetermined amounts of oxygen and boron is grown on the wafer. Then, the composite layer is annealed to obtain a predetermined resistivity.

Figure 20:
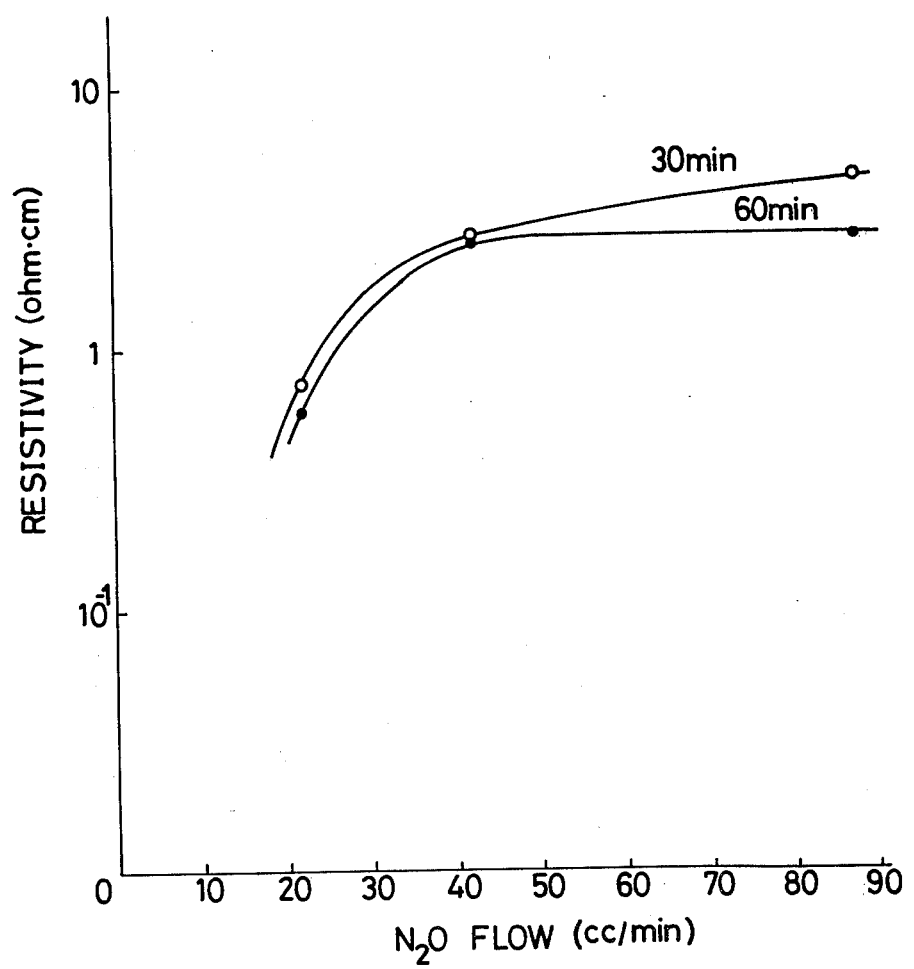
FIG. 20 is a graph showing the relationship between resistivity and flow rate of $N_2O$ at a constant rate of $B_2H_6$ and at different annealing times.

FIG. 20 shows the experimental results of the relationship between the resistivity and the flow rate of $N_2O$. In this embodiment, the flow rate of $SiH_4$ was 30 cc/min, the flow rate of $B_2H_6$ 100 ppm × 1/min and the flow rate of $N_2$ gas 25/min. The composite layer was grown at the temperature of 640° C. The annealing time was changed as 30 minutes and one hour. The flow rate of $B_2H_6$ was so high that the concentration of boron in the composite layer approximates the saturation point. Accordingly, the desired resistivity could be easily obtained under the control of the flow rate of $N_2O$.

Figure 21:
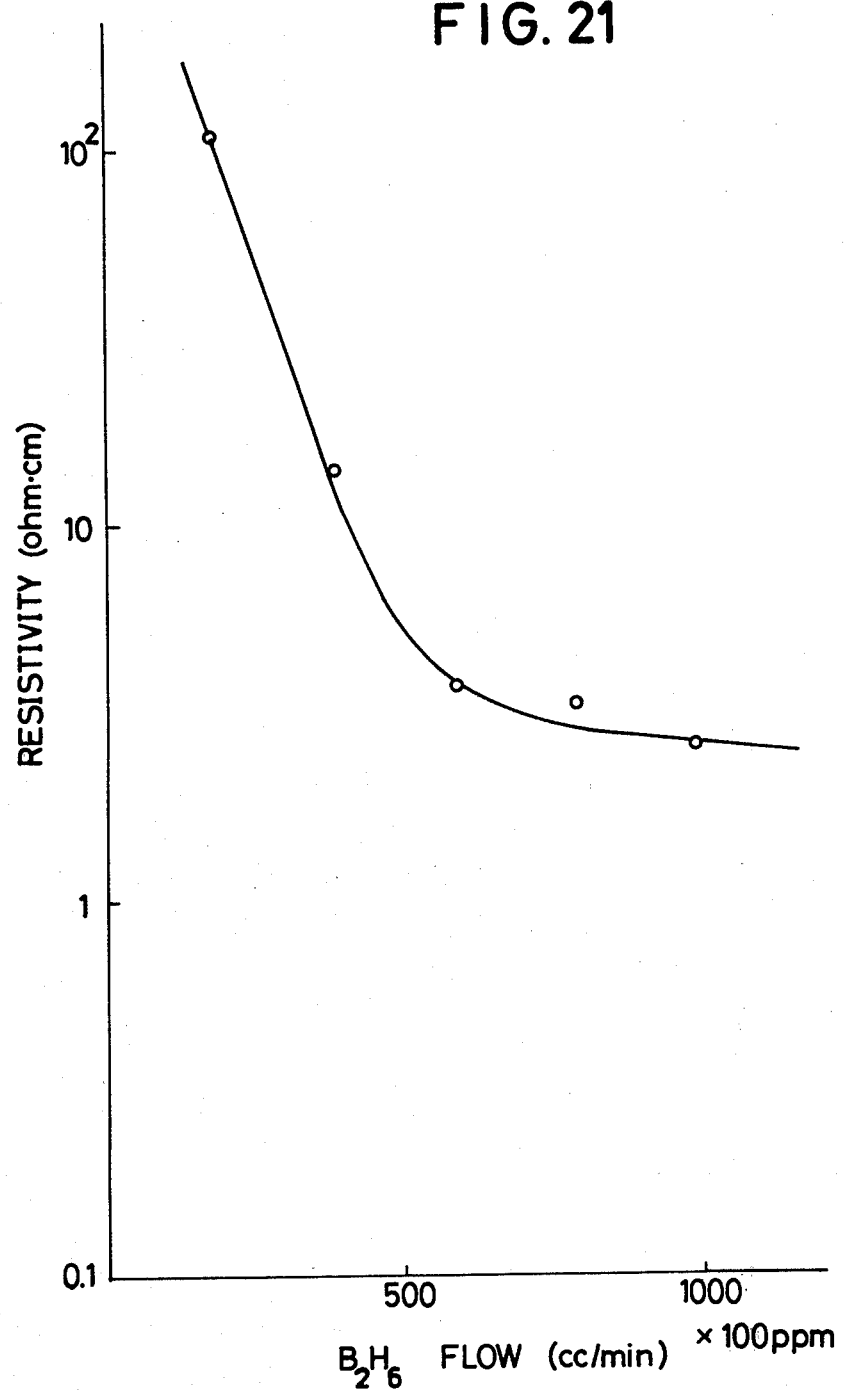
FIG. 21 is a graph showing the relationship between resistivity and flow rate of $B_2H_6$.

FIG. 21 shows the experimental results of the relationship between the resistivity and the flow rate of $B_2H_6$. In this experiment, the flow rates of $SiH_4$ and $N_2O$ were 30 cc/min and 44 cc/min. The compound layer was grown at the temperature of 640° C. The annealing temperature and time were 1000° C. and one hour, respectively. It will be understood from FIG. 21 that a desired resistivity can be easily obtained with the control of the flow rate of $B_2H_6$.

Figure 22:
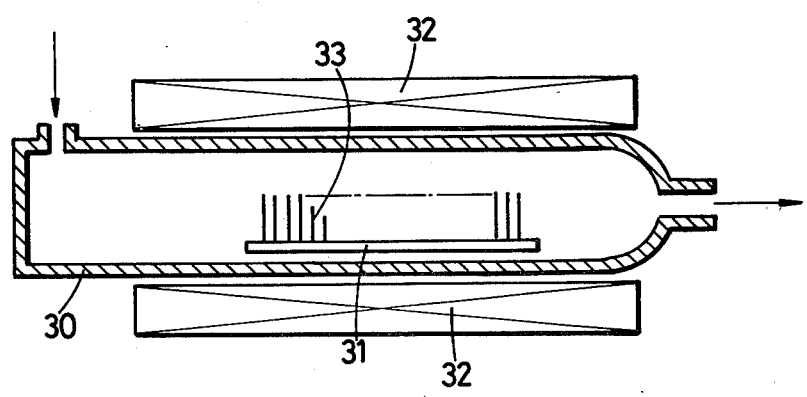
FIG. 22 is a schematic cross-sectional view of another vapor growth apparatus.

A reaction furnace shown in FIG. 22 was used in the above-described manufacturing method. More wafers can be set in the reaction furnace of FIG. 22 than in the reaction furnace of FIG. 12. The uniformity of the thickness an property of the film formed by the reaction furnace of FIG. 22 is satisfactory. The reaction furnace of FIG. 22 is of the reduced pressure type. A reaction mixing-gas is introduced from one end of a furnace 30 into the latter. Gas is discharged from another end of the furnace 30 by a vacuum pump. The interior of the furnace 30 is heated to a predetermined temperature by a heater 32 arranged around the furnace 30. Numerous wafers 33 are set up in a boat 31, in the furnace 30.

When impurity of P-type such as $B_2H_6$ is introduced into a usual reaction furnace operating under the atmosphere to form a composite layer, it has been proved that the resistivity of the produced composite layer varies in the flow direction of the reaction gas. On the other hand, when impurity of P-type such as $B_2H_6$ is introduced into the reaction furnace of the reduced-pressure type operating under a reduced pressure such as 0.2 to 2 Torr, the variation of the resistivities of the wafers is greatly reduced. The uniformity is greatly improved.

For example, when usual reaction furnace operating under the atmosphere is used for forming the composite layer, the variation of the resistivity extends from 0.3Ω·cm to 71.9Ω·cm. On the other hand, when the reaction furnace operating under the reduced pressure is used for forming the composite layer, the variation of the resistivity extends only from 13Ω·cm to 16Ω·cm. Thus, the uniformity of the resistivity is satisfactory.

In the above-described methods, reaction materials in the form of gases are supplied into the furnace for forming the composite layer. However, reaction materials initially in the form of liquid or solid may be supplied into the furnace for forming the composite layer. In this case, such materials are gasified on the wafers. It is possible that $SiH_4$ and $N_2O$ are first supplied into the furnace in order to form a polysilicon film containing a predetermined amount of oxygen on the wafer, and then impurity is supplied into the furnace so as to dope the polysilicon film to a concentration near the saturation point. It is possible that $SiH_4$ and $PH_3$ are first supplied into the furnace to form a polysilicon film containing impurity at a high concentration such as 2 to 3 at%, and then the polysilicon film is doped with oxygen. In both cases, the resistive film having a desired resistivity can be obtained by annealing. In the former case, impurity such as phosphor may be diffused into the composite layer from the surface by a predeposition method or it may be thermally diffused into the composite layer by a doped oxide method. In the latter case, oxygen may be diffused into the composite layer from the surface to dope the composite layer with a predetermined amount of oxygen.

The above-described layer can function as a resistor at the cathode side of a GCS (Gate Controlled Switch) or GTO thyrister (Gate Turn-Off Thyristor).

Next, a GCS according to a third embodiment of this invention will be described with reference to FIG. 23.

Figure 23:
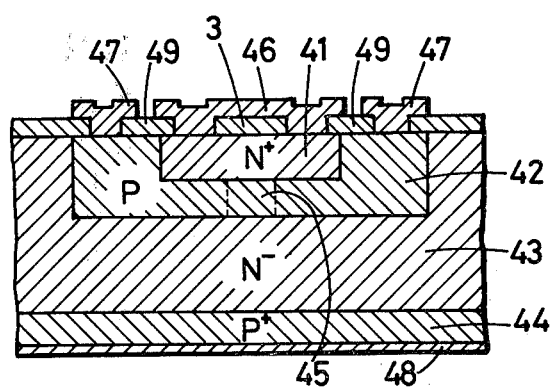
FIG. 23 is a cross-sectional view of a GCS (Gate Controlled Switch) according to a third embodiment.

In FIG. 23, an N+-type semiconductor region 41 forming a cathode region is formed on a P-type semiconductor region 42 serving as a gate region. A P+-type semiconductor region 44 forming an anode region is formed beneath an N−-type semiconductor region 43 serving as a base region on which the P-type region 42 is formed. A cathode electrode 46 is attached to the N+-type semiconductor region 41. A gate electrode 47 and an anode electrode 48 are attached to the P-type semiconductor region 42 and the P+-type semiconductor region 44. A reference numeral 49 represents $SiO_2$ film. It is important that a POPOS film 3 serving as a resistor be formed on a portion of the surface region of the cathode region 41 which is aligned with a portion 45 of the gate region 42, and that the POPOS film 3 is covered with the cathode electrode 46. When the GCS of FIG. 23 is put into the non-conductive state, currents are apt in concentrate to the portion 45 of the gate region 42, if the POPOS film 3 is not present. It is preferable that the resistivity of the film 3 serving as the resistor be within the range of 10 to 100Ω·cm. It is more preferable that it be as small as possible within the above described range.

When the GCS of FIG. 23 is put into the non-conductive state, the cathode voltage rises due to the resistance of the POPOS film 3 to reversely bias the gate-cathode. Accordingly, currents do not flow to the cathode, but only to the gate. For example, when the area of the portion 45 of the gate region 42 will be 100μ×100μ, the thickness of the resistive film 3 is 1μ, and the resistivity thereof is 10Ω·cm, and the cathode resistance R is represented by the following equation:

$$R = \frac{1 \times 10^{-4} \times 10}{(100 \times 10^{-4})^2} = 10 \ (\Omega).$$

Accordingly, when a current of 1A flows, the cathode voltage becomes 10 V to reversely bias the gate-cathode.

For a comparison experiment, the GCS according to this embodiment, and a conventional GCS without film 3 were assembled into a deflecting circuit in a television receiver. The thickness of the used film 3 was 1μ, and the resistivity thereof was 50Ω·cm. The conventional GCS was broken in only one discharging operation. On the other hand, the specific sample according to this embodiment was not broken in thousands of discharging operations. The maximum current was about 21 to 22A.

Thus, the concentration of the currents is effectively avoided by the resistive film 3. The GCS is protected. Even when the gate is broken and current cannot be led out from the gate, the output circuit is automatically put into the OFF condition by the function of the resistive film 3. This is very advantageous. Further, the dV/dt characteristic is improved. For example, when working current is increased from 20 A to 40 A, no trouble results.

The position and area of the film 3 are not limited to those described in the above described embodiment. For example, film 3 may be arranged in the center of the cathode region 41. The area of the film 3 may be wider than the area of the portion 45 of the gate region 42. In this case, it is preferable that the area of the film 3 be wider by more than 10% than the area of the portion 45 of the gate region 42. It is preferable that the area of the film 3 be smaller than 95% of the area of the cathode region 41.

In the transistor FIG. 10, the above described film can be utilized as an emitter ballast resistor. Since the film has suitably controlled resistivity, it can function as an emitter ballast resistor to prevent concentration of current. Accordingly, the problem of the decrease of strength of the transistor due to small size, which cannot be avoided, can be solved by use of the film. In the conventional transistor, a ballast resistor is arranged apart from an emitter region. Accordingly, the area of the device of this invention can be smaller than that of the conventional device. This invention can provide a power transistor for high speed and high frequency which is strong and superior in integrating density.

In the above-described embodiment, the base region 2 may be formed by an ion implantation method. In this case, $h_{FE}$ can be adjusted within the range of about 10 to several hundreds in accordance with the amount of ions. The breakdown voltage can be raised to more than 1000 V by arrangement of a guard ring. A factor $f_T$ can be larger than 100 MHZ ($f_F \geq 100$ MHZ). A switching action is several times to ten times as fast as that of the conventional transistor having the same breakdown voltage and working current although it depends on a measuring circuit. The temperature characteristic of the resistive film $3b$ according to the embodiment of this invention is negative. The mechanism for conduction is apparently different from that of a usual transistor.

In the conventional transistor, a base electrode consists of Ti- W. It is required that the surface concentration of the base region be as high as $1 \times 10^{19}/cm^3$ for obtaining good contact between base region and Ti- W. For that requirement, a P+-type base contact diffusion region having high concentration should be previously formed under the base electrode. On the other hand, the base electrode 6 according to the embodiment of this invention is made of Al. The base region 2 contacts with the Al-layer. Accordingly, the surface concentration of the base region of the embodiment does not need to be as high as that of the conventional transistor for base ohmic contact. A window etching process for forming the high concentration diffusion region is not needed for the transistor according to the embodiment of this invention.

In the manufacture of the transistor according to the embodiment of this invention, a window for depositing base electrode is etched in the $SiO_2$ film 8, using a photo resist. Al is vapor-deposited on the whole surface of the used photo resist. The residue of the photo resist is removed by an etching operation. At that time, Al-layer deposited on the photo resist portion is lifted off, and the Al-layer 8 remains only at the opening of the photo resist for etching the window. The conventional process does not include such lift-off operation. However, one operation for etching $SiO_2$ can be omitted according to the embodiment of this invention. Satisfactory ohmic contact can be obtained by Al-layer construction of electrodes as above described.

Although the illustrative embodiments of the invention have been described in detail herein with referene to the accompanying drawings, it is to be understood that the invention is not limited to those precise embodiments, and that various changes and modifications can be effected therein by one skilled in the art without departing from the scope and spirit of the invention as defined in the appended claims. For example, the above-described material of this invention may be in an amorphous state.

What is claimed is:
1. A semiconductor device comprising, a monocrystalline silicon substrate having a first region of a first conductivity type, a second region of a second conductivity type in said substrate, a third region of the first conductivity type having a first portion adjacent to said second region, said first portion of said third region forming a junction with said second region, a second portion of said third region comprised of phosphorous and polycrystalline silicon doped with oxygen, the band gap energy of said second portion being larger than that of said substrate, and means for forwardly biasing said junction to transport majority carriers in said third region to said first region.

2. A semiconductor device according to claim 1, in which the width and the impurity concentration of said first portion is such that said width is smaller than the diffusion length of minority carriers therein.

* * * * *